(12) United States Patent
Takami

(10) Patent No.: US 7,427,764 B2
(45) Date of Patent: Sep. 23, 2008

(54) LASER CRYSTALLIZATION APPARATUS AND LASER CRYSTALLIZATION METHOD

(75) Inventor: Yoshio Takami, Yokohama (JP)

(73) Assignee: Advanced LCD Technologies DEvelopmet Center Co., Ltd., Yokohama (JP)

( * ) Notice: Subject to any disclaimer, the term of this patent is extended or adjusted under 35 U.S.C. 154(b) by 348 days.

(21) Appl. No.: 11/104,629

(22) Filed: Apr. 13, 2005

(65) Prior Publication Data

US 2006/0019503 A1    Jan. 26, 2006

(30) Foreign Application Priority Data

Jul. 22, 2004    (JP) .............................. 2004-214642

(51) Int. Cl.
    *G21G 5/00*    (2006.01)
(52) U.S. Cl. ...................... 250/492.2; 257/E21.529; 257/E21.53; 438/7
(58) Field of Classification Search ............... 438/795, 438/7, 16; 250/492.2; 257/E21.529, E21.53
    See application file for complete search history.

(56) References Cited

U.S. PATENT DOCUMENTS

| 6,073,464 | A  | * | 6/2000  | Boher et al.      | 65/378    |
| 6,453,084 | B1 | * | 9/2002  | Stanford et al.   | 385/18    |
| 6,593,216 | B1 | * | 7/2003  | Yamazaki et al.   | 438/487   |
| 6,594,006 | B1 | * | 7/2003  | Muehlhoff et al.  | 356/139.03|
| 6,750,423 | B2 | * | 6/2004  | Tanaka et al.     | 219/121.73|
| 7,247,813 | B2 | * | 7/2007  | Jyumonji et al.   | 219/121.83|
| 2003/0016349 | A1 | * | 1/2003  | Tsumura et al.    | 356/237.2 |
| 2005/0202596 | A1 | * | 9/2005  | Fukuyo et al.     | 438/113   |
| 2005/0255716 | A1 | * | 11/2005 | Tanaka et al.     | 438/795   |
| 2005/0282364 | A1 | * | 12/2005 | Seki et al.       | 438/479   |

FOREIGN PATENT DOCUMENTS

JP    11274093    * 10/1999

OTHER PUBLICATIONS

Kohki Inoue, et al., Amplitude and Phase Modulated Excimer-Laser Melt-Regrowth Method of Silicon Thin-Films—A New Growth Method of 2-D Position-Controlled Large-Grains, Journal of the Society of Electron Information Communication, vol. J85-C, No. 8, 2002, pp. 624-629.

* cited by examiner

*Primary Examiner*—Caridad M Everhart
(74) *Attorney, Agent, or Firm*—Oblon, Spivak, McClelland, Maier & Neustadt, P.C.

(57) ABSTRACT

A laser crystallization apparatus which capable of correcting both shift in imaging position caused by thermal lens effect of the imaging optical system and shift due to flatness of the substrate comprises an crystallization optical system which irradiates laser light to a thin film disposed on the substrate to melt and crystallize an irradiated region of the thin film, the apparatus includes a measurement light source which is disposed outside a light path of the laser light, and which emits measurement light being illuminated the irradiated region of the thin film, and a substrate height correction system which illuminates the thin film with the measurement light through an imaging optical system in the crystallization optical system, and which detects the reflected measurement light from the thin film.

6 Claims, 7 Drawing Sheets

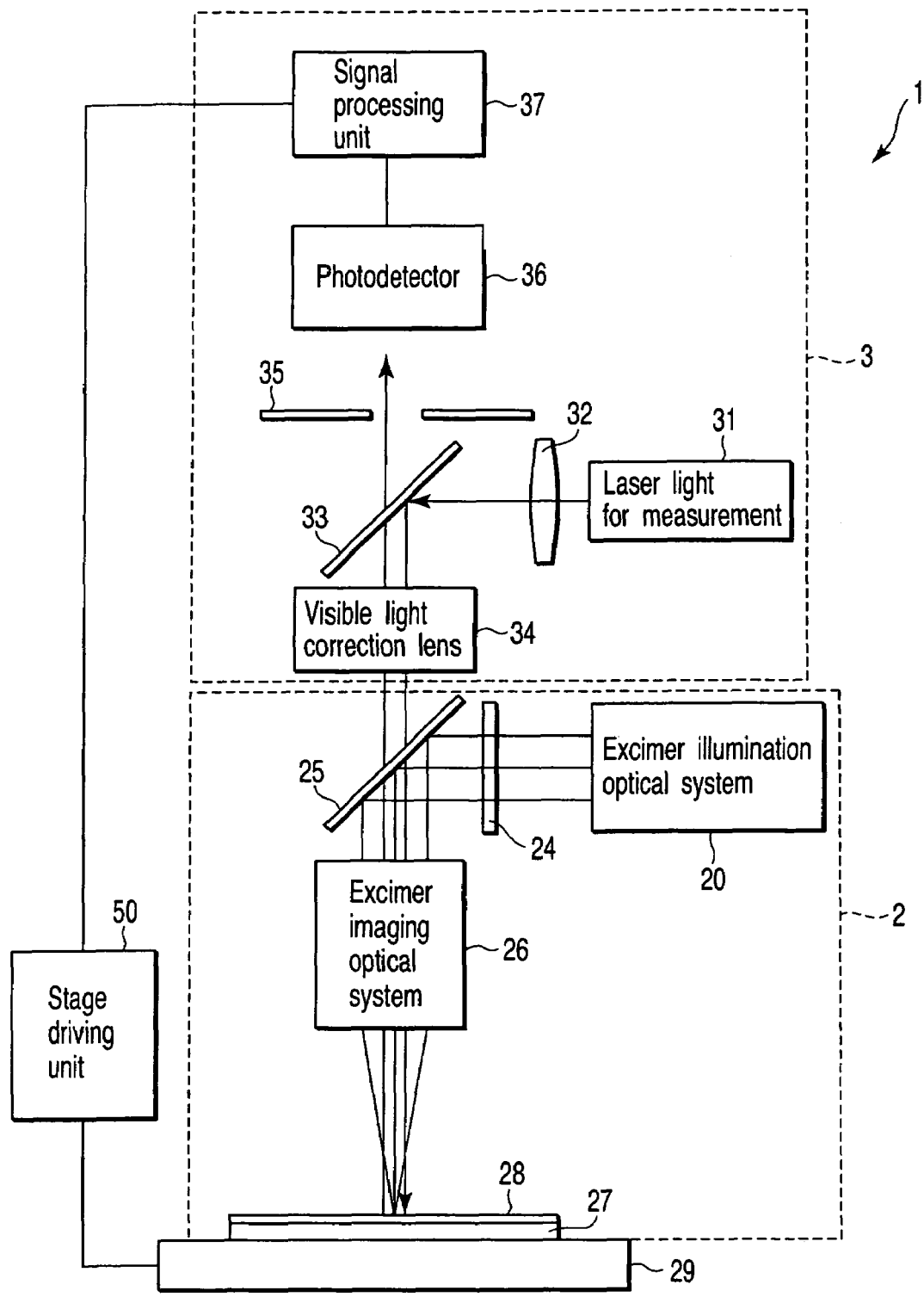
F I G. 1

LASER CRYSTALLIZATION APPARATUS AND LASER CRYSTALLIZATION METHOD

CROSS-REFERENCE TO RELATED APPLICATIONS

This application is based upon and claims the benefit of priority from prior Japanese Patent Application No. 2004-214642, filed Jul. 22, 2004, the entire contents of which are incorporated herein by reference.

BACKGROUND OF THE INVENTION

1. Field of the Invention

The present invention relates to a crystallization apparatus which irradiates laser light to a thin film such as a semiconductor film and to a crystallization method, particularly to a laser crystallization apparatus comprising means for correcting positional shift of a semiconductor film with respect to an imaging position of laser light, and a laser crystallization method.

2. Description of the Related Art

A laser crystallization technique for melting and crystallizing a non-single crystal semiconductor thin film using, for example, short pulse laser light having large energy is used to crystallize a semiconductor thin film used for manufacturing a thin film transistor for a liquid crystal display device, an organic electro luminescence display device or the like.

Among such laser crystallization technologies, attention is focused on a Phase Modulated Excimer Laser Annealing (PMELA) which uses an irradiation of a phase-modulated excimer laser light for crystallization. In the PMELA technique, excimer laser light having predetermined light intensity distribution whose phase has been modulated by a phase modulating element, for example, a phase shifter, is used. The excimer laser light is irradiated, for example, to a non-single crystal semiconductor thin film, for example, an amorphous silicon or polycrystal silicon thin film, formed on a glass substrate. The semiconductor film is molten at the irradiated portion then crystallized. In the presently developed PMELA technique, a region having a size of approximately several millimeter square is molten and crystallized by one irradiation, and a crystallized silicon thin film having comparatively uniform crystal grains of about several micrometers to 10 μm in size and having a superior quality has been formed (see, e.g., Kohki Inoue, Mitsuru Nakata, Masakiyo Matsumura, "Amplitude and Phase Modulated Excimer-Laser Melt-Regrowth Method of Silicon Thin-Films—A New Growth Method of 2-D Position-Controlled Large-Grains—", Journal of the Society of Electron Information Communication, Vol. J85-C, No. 8, pp. 624 to 629, 2002).

In the PMELA technique, in order to obtain a crystallized semiconductor film having a stabilized quality, it is one of important technical problems to constantly align a position of the non-single crystal semiconductor thin film being crystallized to an imaging position of the excimer laser light in every laser light irradiation for crystallization. Since a substrate to be crystallized has a large area, for example, 550 mm×650 mm, the substrate has its own warp, thickness variation, deflection in installing to the PMELA apparatus and the like. Therefore, substantial flatness of the substrate is generally worse than a focal depth of a laser optical system, for example, ±5 μm to 10 μm.

To solve the problem, some conventional laser crystallization apparatus comprises a fixed substrate height measurement sensor. Examples of typical fixed substrate height measurement sensor include an optical system, electrostatic capacitance system, or gas pressure system. Substrate height correction using such fixed sensor is suitable for correcting a shift caused by the above-described flatness of the substrate.

However, in the laser crystallization apparatus, as described later in detail, since crystallization laser light having high energy is used, lens temperature of an excimer imaging optical system rises during use, and it causes a shift in the imaging position of the excimer imaging optical system. In a correction method using the conventional fixed substrate height measurement sensor, the shift of the imaging position caused by the laser crystallization apparatus itself due to the temperature change in the excimer imaging optical system cannot be corrected in principle.

As described above, in the laser crystallization apparatus, the imaging position of the crystallization laser light is preferably constantly aligned to the non-single crystal semiconductor thin film to be molten and crystallized in order to improve and stabilize the quality of the crystallized semiconductor film. If a shift is generated between the imaging position of the crystallization laser light and the position (height) of the non-single crystal semiconductor thin film disposed on the substrate, then desired crystallization is not performed in a crystallization step after melting the semiconductor thin film.

Especially in the PMELA apparatus, the crystallization laser light to be irradiated to the non-single crystal semiconductor thin film is modulated by an optical system in such a manner as to have a predetermined light intensity distribution on the non-single crystal semiconductor thin film being crystallized. However, if the shift is caused between the imaging position of the laser light and the position of the non-single crystal semiconductor thin film, then a predetermined light intensity distribution cannot be obtained on the non-single crystal semiconductor thin film. Therefore, a micro temperature distribution in the laser light irradiation region changes from a predetermined distribution. As a result, a desired melting or crystallization of semiconductor film is not performed. Specifically, a size of crystal grain grown is reduced. Additionally, the sizes of the crystal grains become nonuniform, thus the quality of the crystallized silicon film is degraded.

As the excimer laser light used in the PMELA apparatus, for example, krypton fluoride (KrF) or xenon chloride (XeCl) is preferred, and they have wavelengths of 248 nm and 308 nm, respectively. In the PMELA apparatus, the excimer laser light having a predetermined light intensity distribution formed by an optical phase modulating element such as a phase shifter is irradiated onto the non-single crystal semiconductor thin film. The excimer laser light should be imaged on the non-single crystal semiconductor thin film with a high resolution of about several μm.

As to the excimer laser light, the PMELA apparatus uses the laser light at a high light intensity, at high duty, and in a large area for production efficiency. The light preferably has a high intensity of about 1 J/cm$^2$ on the semiconductor thin film to be crystallized. This is much larger than an intensity of an excimer laser light used in an aligner for semiconductor integrated circuit production. In order to obtain the high light intensity, in the PMELA apparatus, the excimer laser light is used with a wide spectral bandwidth (0.5 nm) without narrowing the bandwidth, unlike in an aligner used for large-scale integrated circuit production.

Moreover, there are limited lens materials capable of dealing with the excimer laser light which is ultraviolet light used in the PMELA apparatus, thus fused silica or synthetic quartz (referred as fused silica hereinafter) for ultraviolet or calcium fluoride ($CaF_2$) is preferable from absorption characteristic and the like of the light. As described above, in the PMELA apparatus using the phase shifter, chromatic aberration correction of a lens is important since the excimer laser light having a large spectrum width is imaged in a high resolution on the non-single crystal semiconductor thin film. However, a constitution of an optical system including a laminated lens like a microscope lens for visible light is not applicable from the respect of heat resistance. Therefore, since the chromatic aberration has to be corrected with the above-described limited lens material, the number of the lenses increases.

If the excimer laser light having the high intensity is used in such lens system, although the excimer laser light is absorbed a little in each lens constituting the optical system, then total laser light absorption in the optical system is large. As a result, a so-called thermal lens effect is caused, for example, lens temperature rises, or the lens is strained. That is, a problem occurs that the imaging position shifts by the thermal lens effect. In one PMELA apparatus, the imaging position shifts, for example, by 10 μm, when the lens temperature changes by 1° C. in the excimer laser imaging optical system. Considering that the focal depth of the imaging optical system of the PMELA apparatus is about ±10 μm, the shift of the imaging position caused by the temperature change is not negligible.

The imaging position shift causes a variation in the quality of the crystallized semiconductor film such as a substrate for a liquid crystal display device having a large area, if the pulse laser light is repeatedly irradiated. As a result, there occur problems such as variation in image switching characteristic of the element formed therein, or a strained image.

In the conventional fixed substrate height correction system, a height shift of the substrate to be crystallized due to the flatness of the substrate itself can be corrected, as described above. However, correction for, for example, the shift of the imaging position caused by above-described thermal lens effect in optical system for excimer laser crystallization has not been considered.

Therefore, there is a need for a laser crystallization apparatus and a laser crystallization method in which a quality of a crystallized semiconductor thin film is prevented from being degraded and in which sizes of crystal grains are uniformed.

BRIEF SUMMARY OF THE INVENTION

The above-described problems can be solved by a laser crystallization apparatus and a laser crystallization method set forth below.

According to an aspect of the invention, a laser crystallization apparatus comprises an crystallization optical system which irradiates laser light to a thin film disposed on a substrate to be crystallized to melt and crystallize an irradiated region of the thin film, the apparatus comprises: a measurement light source which is disposed outside a light path of the laser light, and which emits measurement light being illuminated the irradiated region of the thin film; and a substrate height correction system which illuminates the thin film with the measurement light through an imaging optical system in the crystallization optical system, and which detects the reflected measurement light from the thin film.

According to another aspect of the invention, a laser crystallization apparatus comprises an crystallization optical system which irradiates laser light provided with a light intensity distribution by a phase modulating element to a thin film disposed on a substrate to be crystallized to melt and crystallize an irradiated region of the thin film, the apparatus comprises: a measurement light source which is disposed outside a light path of the laser light, and which emits measurement light being illuminated the irradiated region of the thin film; and a substrate height correction system which illuminates the thin film with the measurement light through an imaging optical system of the crystallization optical system, and which detects the reflected measurement light from the thin film.

According to still another aspect of the invention, a laser crystallization method comprises: emitting laser light from a laser light source; irradiating the laser light to a thin film disposed on a substrate to be crystallized through an imaging optical system disposed in a light path of the laser light, and melting and crystallizing the thin film; emitting measurement light from a light source disposed outside the light path of the laser light; illuminating the thin film with the measurement light along the light path of the laser light through the imaging optical system; and detecting the reflected measurement light from the thin film through the imaging optical system.

According to still another aspect of the invention, a laser crystallization method comprises: emitting laser light from a laser light source; modulating the laser light into laser light having a predetermined light intensity distribution by a phase modulating element; irradiating the modulated laser light to a thin film disposed on a substrate to be crystallized through an imaging optical system disposed in a light path of the laser light, and melting and crystallizing the thin film; emitting measurement light from a light source disposed outside the light path of the laser light; illuminating the thin film with the measurement light along the light path of the laser light through the imaging optical system; and detecting the reflected measurement light from the thin film through the imaging optical system.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a schematic drawing showing a main part of a laser crystallization apparatus according to a first embodiment of the present invention;

DETAILED DESCRIPTION OF THE INVENTION

Figure 2:
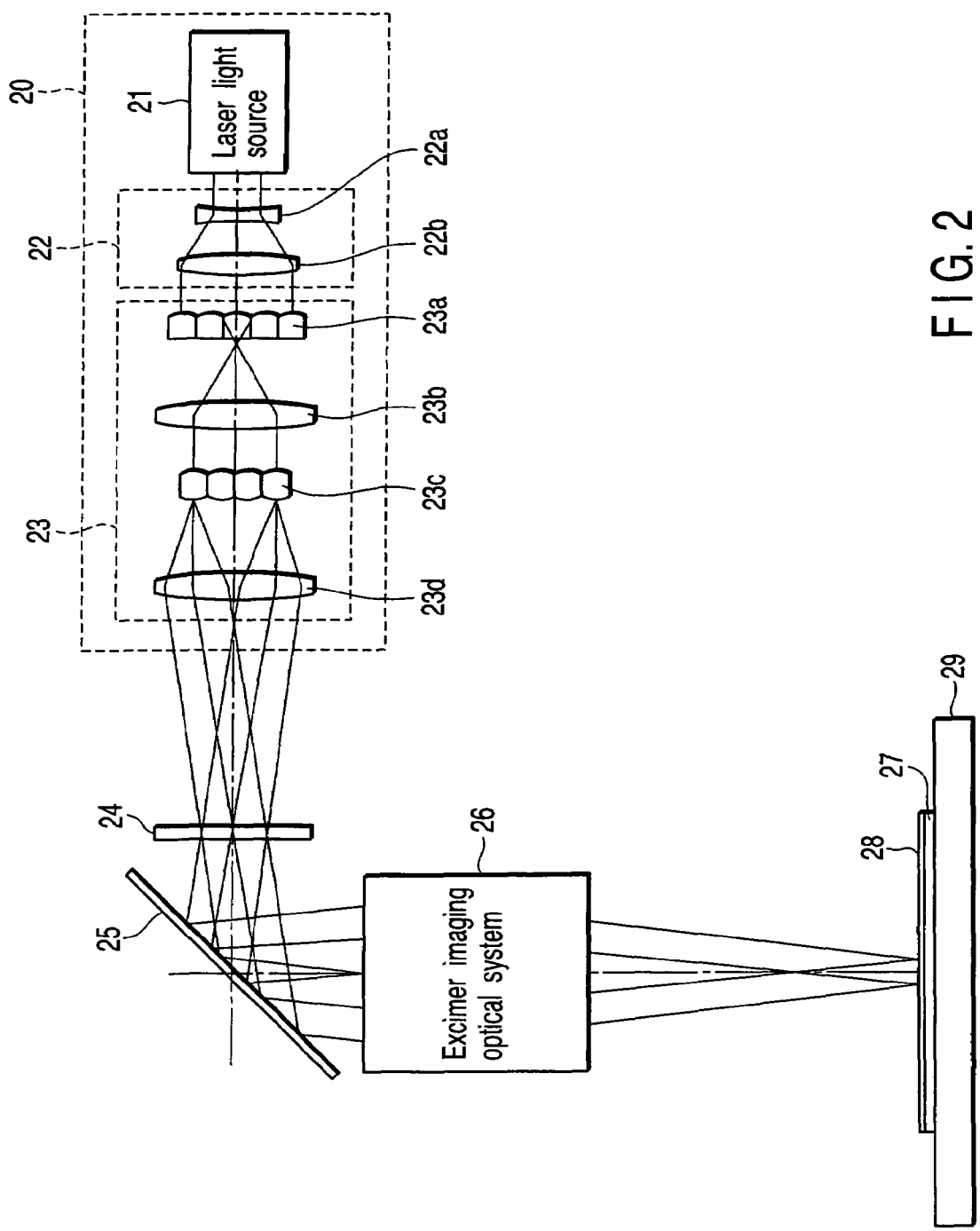
FIG. 2 illustrates one example of the main part of a laser crystallization optical system using a phase shifter used in the laser crystallization apparatus of FIG. 1.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit.

Embodiments of a laser crystallization apparatus of a semiconductor film comprising a substrate height correction system according to the present invention will be described with reference to the drawings.

FIRST EMBODIMENT

FIG. 1 is a schematic diagram of a laser crystallization apparatus 1 according to a first embodiment of the present invention. The apparatus is a laser crystallization apparatus 1 comprising a crystallization optical system 2 projecting an image of a phase modulating element 24 in a reduced size, and a substrate height correction system 3. The apparatus has a function for correcting a shift in a height direction of a substrate 27 to be crystallized based on measurement of the substrate height correction system 3.

The crystallization optical system 2 comprises an excimer illumination optical system 20 and an excimer imaging optical system 26. The excimer illumination optical system 20 emits and conditions crystallization laser light which illuminates the phase modulating element 24, for example, a phase shifter. The excimer imaging optical system 26 irradiates crystallization laser light whose phase has been modulated by the phase shifter 24 onto a non-single crystal semiconductor thin film 28 disposed on the substrate 27 to be crystallized.

FIG. 2 is a diagram showing one example of the crystallization optical system 2 using the phase shifter 24 used in the laser crystallization apparatus 1 shown in FIG. 1. The excimer illumination optical system 20 further comprises a laser light source 21, a beam expander 22, and a homogenizer 23 which are disposed on the same optical axis.

The laser light source 21 preferably has high energy, for example, of 1 J/cm$^2$ for melting and crystallizing the semiconductor thin film 28 formed on the substrate 27. Therefore, for example, excimer laser light such as krypton fluoride (KrF) excimer laser (wavelength of 248 nm) or xenon chloride (XeCl) excimer laser (wavelength of 308 nm) is preferably used.

The excimer laser light source 21 generally used in the PMELA apparatus is a pulse oscillation type, an oscillation frequency is, for example, 100 Hz to 300 Hz, and a pulse width is of, for example, 20 nsec to 100 nsec in a half value width. In the present embodiment, the KrF excimer laser light having a half value width of 25 nsec is used. The KrF excimer laser light irradiated onto the substrate 27 to be crystallized has light energy, for example, of about 1 J/cm$^2$. Assuming that oscillation frequency is, for example, 100 Hz, and an irradiation area of the excimer laser light is, for example, 2 mm×2 mm. The excimer laser light is irradiated step by step, while the substrate 27 to be crystallized is moved by a substrate holding stage 29, for example, by a step of 2 mm. In this case, a moving speed of the substrate 27 becomes 200 mm/sec.

The beam expander 22 expands an incident laser light beam, and is constituted of a concave lens 22a for expanding light and a convex lens 22b for forming parallel light.

The homogenizer 23 has a function of determining a dimension of a cross section in an XY direction of the incident laser light beam, and homogenizing a light beam intensity distribution within a determined shape. For example, a plurality of X-direction cylindrical lenses are arranged in a Y-direction to form a plurality of light fluxes arranged in the Y-direction, then each light flux is re-distributed in the Y-direction by an X-direction condenser lens. Similarly, a plurality of Y-direction cylindrical lenses are arranged in the X-direction to form a plurality of light fluxes arranged in the X-direction, then each light flux is re-distributed in the X-direction by a Y-direction condenser lens. That is, as shown in FIG. 2, the homogenizer comprises a first homogenizer constituted of a first fly eye lens 23a and a first condenser lens 23b, and a second homogenizer constituted of a second fly eye lens 23c and a second condenser lens 23d. The first homogenizer homogenizes incident angles of the laser light on the phase shifter 24, and the second homogenizer homogenizes an in-plane laser light intensity on the phase shifter 24. Therefore, the KrF excimer laser light is conditioned to illumination light having a predetermined angle spread and a homogenized light intensity in a cross section by the homogenizer 23 to thereby illuminate the phase shifter 24.

The phase shifter 24 is one example of a phase modulating element, and constituted, for example, by stepping a quartz glass substrate. Diffraction and interference of the laser light are caused in step boundaries, thus periodic distribution is given to the laser light intensity, for example, a phase difference of 180° is made in right and left side of the boundary. The phase shifter 24 for making the right/left phase difference of 180° modulates the phase of incident light, and constitutes an inverse peaked light intensity distribution symmetric with respect to the step boundary. A step height (thickness difference) d required for forming the light intensity distribution is obtained by $d=\lambda/2(n-1)$, where $\lambda$ denotes a wavelength of the laser light, and n denotes a refractive index of a transparent substrate of the phase shifter 24. From this equation, the phase shifter 24 can be manufactured, for example, by forming a step height corresponding to a predetermined phase difference on a quartz glass substrate. For example, assuming that the refractive index of the quartz substrate is 1.46, the XeCl excimer laser light has a wavelength of 308 nm, and therefore the step height for making a phase difference of 180° becomes 334.8 nm. The step of the quartz glass substrate can be formed by selective etching or focused ion beam (FIB) processing, for example.

In the phase shifter 24, the step is formed in such a manner that the phase of the excimer laser light is shifted by a half wavelength at the boundary to modulate the incident light to form the inversed peaked light intensity distribution. As a result, the laser light, which irradiates the semiconductor film, has a light intensity distribution patterned in such a manner as to have an inverse peak. As for the light intensity distribution, light intensity at a portion corresponding to the phase shift portion has a minimum. According to this method, a predetermined laser light intensity distribution can be realized without blocking the excimer laser light by a metal pattern used in another method.

As to the excimer laser light passed through the phase shifter 24, a direction of the laser light is changed in a direction to the substrate 27 to be crystallized by a reflecting mirror 25. The laser light is imaged in a predetermined light intensity distribution on the non-single crystal semiconductor thin film 28 on the substrate 27, which is positioned at a conjugate position with the phase shifter 24, by the excimer imaging optical system 26 whose aberration has been corrected. The reflecting mirror 25 is designed in such a manner as to reflect ultraviolet light while pass visible light.

The imaging optical system 26 comprises a lens group constituted, for example, of a plurality of calcium fluoride ($CaF_2$) lenses and fused silica lenses. The imaging optical system 26 is a long focal distance lens having performances such as a reduction ratio: 1/5, N.A.: 0.13, resolution: 2 μm, depth of focus: ±10 μm, and focal distance: 50 mm to 70 mm.

The imaging optical system 26 arranges the phase shifter 24 and the non-single crystal semiconductor thin film 28 on the substrate 27 in an optically conjugate position with respect to the excimer laser light. In other words, the non-single crystal semiconductor thin film 28 is positioned on a plane optically conjugate with the phase shifter 24 (e.g., imaging plane of the imaging optical system). The imaging optical system 26 comprises an aperture disposed between the lenses.

With regard to the substrate 27 to be crystallized, in general, the non-single crystal semiconductor thin film 28 is formed on the substrate via an insulating film, and another insulating film is provided on the semiconductor film as a cap film. The substrate is, for example, a transparent glass substrate, plastic substrate, or a semiconductor substrate (wafer) such as silicon. The non-single crystal semiconductor thin film 28 to be crystallized is an amorphous silicon film, a polycrystal silicon film, a sputtered silicon film, a silicon germanium film, or a dehydrogenated amorphous silicon film. The substrate 27 to be crystallized used in the present embodiment, the dehydrogenerated amorphous silicon film 28 is formed in a desired thickness, for example, of 50 nm on the glass substrate. The substrate 27 is detachably mounted on the substrate holding stage 29 which places the substrate in a predetermined position and which is movable in X, Y, and Z-directions.

As described above, the laser crystallization apparatus 1 is a projecting type crystallization apparatus. The homogenized laser light is modulated in phase by the phase shifter 24 to thereby form crystallization laser light having an inverse peaked light intensity distribution, and the laser light is irradiated onto the non-single crystal semiconductor thin film 28 formed on the substrate 27. In the non-single crystal semiconductor thin film 28 molten by the laser light irradiation, the crystallization proceeds in a horizontal direction in accordance with the light intensity distribution, and the crystallized semiconductor film 28 having large single-crystal grains, for example, of about 10 μm can be formed.

As described above, in the laser crystallization apparatus 1, an image of the phase shifter 24 is formed on the non-single crystal semiconductor thin film 28 formed on the substrate 27 using the excimer laser light having high energy of about 1 $J/cm^2$. As a result, the irradiated region of the non-single crystal semiconductor thin film 28, on which the image has been formed, is molten, then solidified and crystallized. In this process, the shift in the imaging position of the laser light caused by the thermal lens effect of the excimer imaging optical system 26 installed between the phase shifter 24 and the substrate 27 directly adversely affects the quality of the crystallized semiconductor film.

Though calcium fluoride and fused silica are preferred lens materials for the excimer imaging optical system 26, transmittance of the calcium fluoride and fused silica for ultraviolet rays in a wavelength region of 200 nm to 300 nm is about 90%, therefore rest of about 10% is absorbed by the lens or a lens holder even if the lens without anti-reflection coating is used. Moreover, since thermal conductivities of calcium fluoride and fused silica are 9.71 (W/m·° C.) and 1.35 (W/m·° C.), respectively, it can be expected that the temperature change of fused silica is larger than that of calcium fluoride. For example, when 200 Hz pulse excimer laser light irradiation is performed for about five minutes with the above-described excimer laser light intensity, it is estimated that a temperature rise of about 5° C. is generated in the calcium fluoride lens, while a temperature rise of about 10° C. to 15° C. is generated in the fused silica lens.

In addition, a thermal expansion coefficient and a temperature coefficient of refractive index are about $2 \times 10^{-5}/°$ C., $-1 \times 10^{-5}/°$ C. in calcium fluoride, respectively, and $4 \times 10^{-6}/°$ C., $1 \times 10^{-5}/°$ C. in fused silica, respectively. Therefore, considering the temperature characteristics of the lens materials in the excimer imaging optical system 26 using the lens group of a plurality of lenses, for example, the imaging position shifts by 10 μm when the lens temperature changes by 1° C. in an excimer imaging optical system. For example, the temperature change in the excimer imaging optical system 26 is estimated about 10° C., as described above, the shift in the imaging position due to the thermal lens effect becomes several tens μm to 100 μm, and it is supposed that the shift is much larger than focal depth ±10 μm of the excimer imaging optical system 26.

If the imaging position of the laser light for the crystallization shifts from the non-single crystal semiconductor film 28 on the substrate 27, then a predetermined light intensity distribution is not obtained on the non-single crystal semiconductor film 28, and it causes the laser light intensity at the phase reversed portion not to be sufficiently low. Therefore, the melt temperature at that portion is higher than that when the non-single crystal semiconductor film 28 is in the imaging position, thus a crystal nucleus formation delays. As a result, a timing to start the crystallization is delayed. Additionally, the crystal nuclei are easily generated at random places even in portions other than the reversed portion of the laser light. As a consequence, an opportunity to meet growing crystal grains with one another increases, thus the size of the crystal grain grown is reduced. That is, the quality of the crystallized silicon film is degraded. Therefore, the imaging position of the excimer imaging optical system 26 by the thermal lens effect is preferably corrected.

Next, the substrate height correction system 3 will be described. The substrate height correction system 3 is to correct the shift of the imaging position caused by the thermal lens effect of the excimer imaging optical system 26 in addition to correct a shift attributed to flatness of the substrate 27.

One example of a constitution of the substrate height correction system 3 of the present embodiment is shown in FIG. 1. In the substrate height correction system 3, a light source 31 for measurement, for example, visible laser light source, emits visible laser light, for example, helium neon (He—Ne) laser light, to measure imaging position. The visible laser light is converged by a converging lens 32, and directed to the substrate 27 to be crystallized by a half mirror 33. The visible laser light for the measurement illuminates the non-single crystal semiconductor film 28 on the substrate 27 through the excimer imaging optical system 26.

However, the excimer imaging optical system 26 is designed for the excimer laser which is ultraviolet light. Therefore, when the visible laser light for the measurement is applied into the excimer imaging optical system 26, aberration is generated. An visible light correction optical system, for example, a visible light correction lens 34, is disposed between the reflecting mirror 25 and the half mirror 33, and out of a light path of the excimer laser light. The visible light correction optical system corrects the aberration of the visible light by the excimer imaging optical system 26. Thus, the visible light correction optical system is designed in such a manner that an imaging plane of the visible laser light for the measurement coincides with that of the excimer laser light for the crystallization. The reflecting mirror 25 for excimer laser light is designed to transmit the visible light as described above.

The non-single crystal semiconductor film 28 on the substrate 27 is disposed in a position conjugated with the focal position of the converging lens 32 with respect to the visible light. The measurement laser light reflected on the non-single crystal semiconductor film 28 passes through the excimer imaging optical system 26 and the visible light correction lens 34 again, and passes through the half mirror 33 and a pinhole 35 to reach a photodetector 36.

The pinhole 35 is disposed in a position conjugated with the imaging position on the substrate 27 side with respect to the laser light for the measurement through the visible light correction lens 34 and the excimer imaging optical system 26. A size of the pinhole 35 is preferably equal to that of the image of the measurement laser light on the imaging position on the substrate 27. By measuring intensity of the measurement laser light passed through the pinhole, or distortion of a visible light image on the non-single crystal semiconductor film 28 by the photodetector 36, a shift in the position of the non-single crystal semiconductor film 28 on the substrate 27 from the imaging position of the crystallization laser light can be detected. As the photodetector 36, for example, a two-dimensional CCD imaging device, a photodiode, a phototransistor, or a photo-multiplier tube can be used. An electric signal corresponding to the shift is detected and converted by the photodetector 36, and then is processed by a signal processing unit 37. A correction amount output from the signal processing unit 37 is send to a stage driving unit 50. The substrate holding stage 29 can be moved under a control of the stage driving unit 50 to correct the shift of the semiconductor film 28 from the imaging position.

Figure 3:
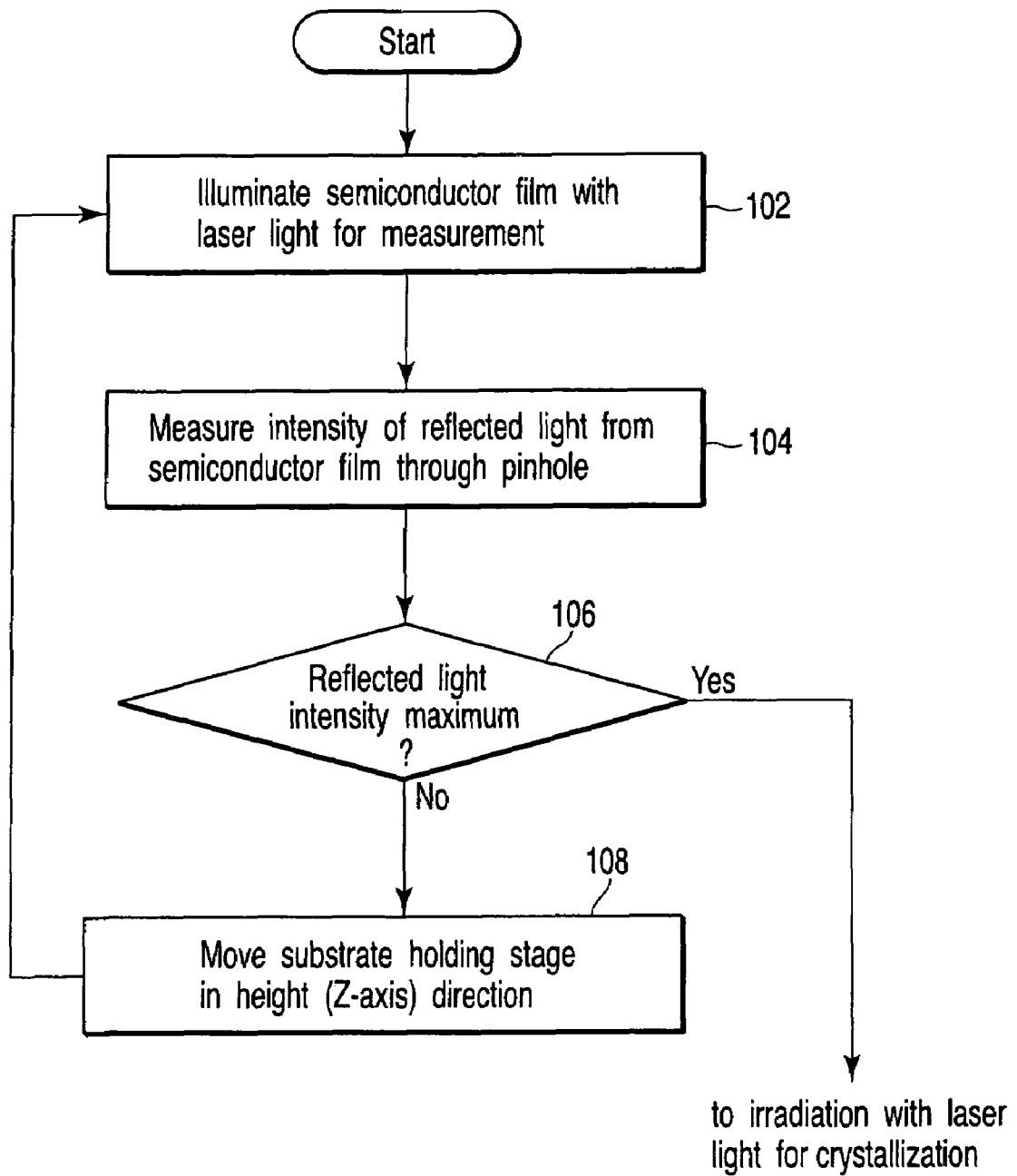
FIG. 3 is a flowchart showing one example of substrate height correction process according to the first embodiment.

A flowchart of a method for correcting the height of the non-single crystal semiconductor film 28 by measuring an incident light intensity from the non-single crystal semiconductor film 28 using the photodetector 36 is shown in FIG. 3.

First, in step 102, the non-single crystal semiconductor film 28 is illuminated with the visible laser light for the measurement. The laser light for the measurement is reflected on the non-single crystal semiconductor film 28, and reaches the photodetector 36 through the pinhole 35 disposed in the position conjugated with the imaging position on the semiconductor film 28 side with respect to the measurement laser light.

In step 104, the intensity of the measurement light passed through the pinhole 35 is measured by the photodetector 36. As an arrangement described above, the size of the image of the measurement laser light on the pinhole 35 plane is equal to that on the non-single crystal semiconductor film 28. If the non-single crystal semiconductor film 28 is in the imaging position, then the size of the image of the measurement laser light on the non-single crystal semiconductor film 28 becomes smallest. As compared with in the imaging position, if the non-single crystal semiconductor film 28 is shifted from the imaging position, then an image of the laser light on the semiconductor film 28 defocuses and enlarges. As a result, the size of the image of the measurement laser light on the pinhole 35 plane is larger than that of the pinhole. Since the size of the pinhole 35 is equal to that of the image of the measurement laser light in the imaging position on the semiconductor film 28 side, the intensity of the measurement laser light reaching the photodetector 36 through the pinhole 35 is reduced as compared with the case where the non-single crystal semiconductor film 28 is in the imaging position.

In step 106, the signal processing unit 37 decides whether the intensity of the reflected light is maximum. If the intensity is not maximum, then the substrate holding stage 29 is moved upward or downward in the height (Z-axis) direction through the stage driving unit 50, in step 108. Then, the process returns to the step 104 to repeat the measurement of the reflected light intensity from the semiconductor film 28.

When the light intensity detected in the step 106 becomes maximum in this manner, substrate position correction ends, and the excimer laser light for the crystallization is irradiated.

In the measurement, the light path of the visible laser light for measurement includes the same excimer imaging optical system 26 as for the crystallization laser light. Therefore, even if the temperature of the excimer imaging optical system 26 changes, thus the imaging position of the excimer laser light for the crystallization shifts by the thermal lens effect, the imaging position of the visible laser light for the measurement similarly shifts. Therefore, if the position of the non-single crystal semiconductor film 28 is corrected in an optical axis direction (Z-axis direction) and coincided with the imaging position of the visible laser light for the measurement, then the non-single crystal semiconductor film 28 can also be coincided with the imaging position of the excimer laser light for the crystallization.

The position of the non-single crystal semiconductor film 28 in the Z-axis direction is corrected immediately before pulse irradiation of the excimer laser light for the crystallization in such a manner that the reflected measurement light intensity from the non-single crystal semiconductor film 28 detected by the photodetector 36 is constantly maximized. Accordingly, the imaging position of the non-single crystal semiconductor film 28 on the substrate 27 can be corrected, so that both the imaging position shift caused by the thermal lens effect of the excimer imaging optical system 26 and the imaging position shift attributed to flatness of the substrate 27 can be corrected simultaneously.

SECOND EMBODIMENT

A second embodiment relates to a correction system 3 and method in which a specific mask pattern is imaged on a non-single crystal semiconductor film 28 on a substrate 27, a reflected image from the non-single crystal semiconductor film 28 is detected by a two-dimensional photodetector 36A, and then an imaging position is corrected using a two-dimensional image detected.

Figure 4:
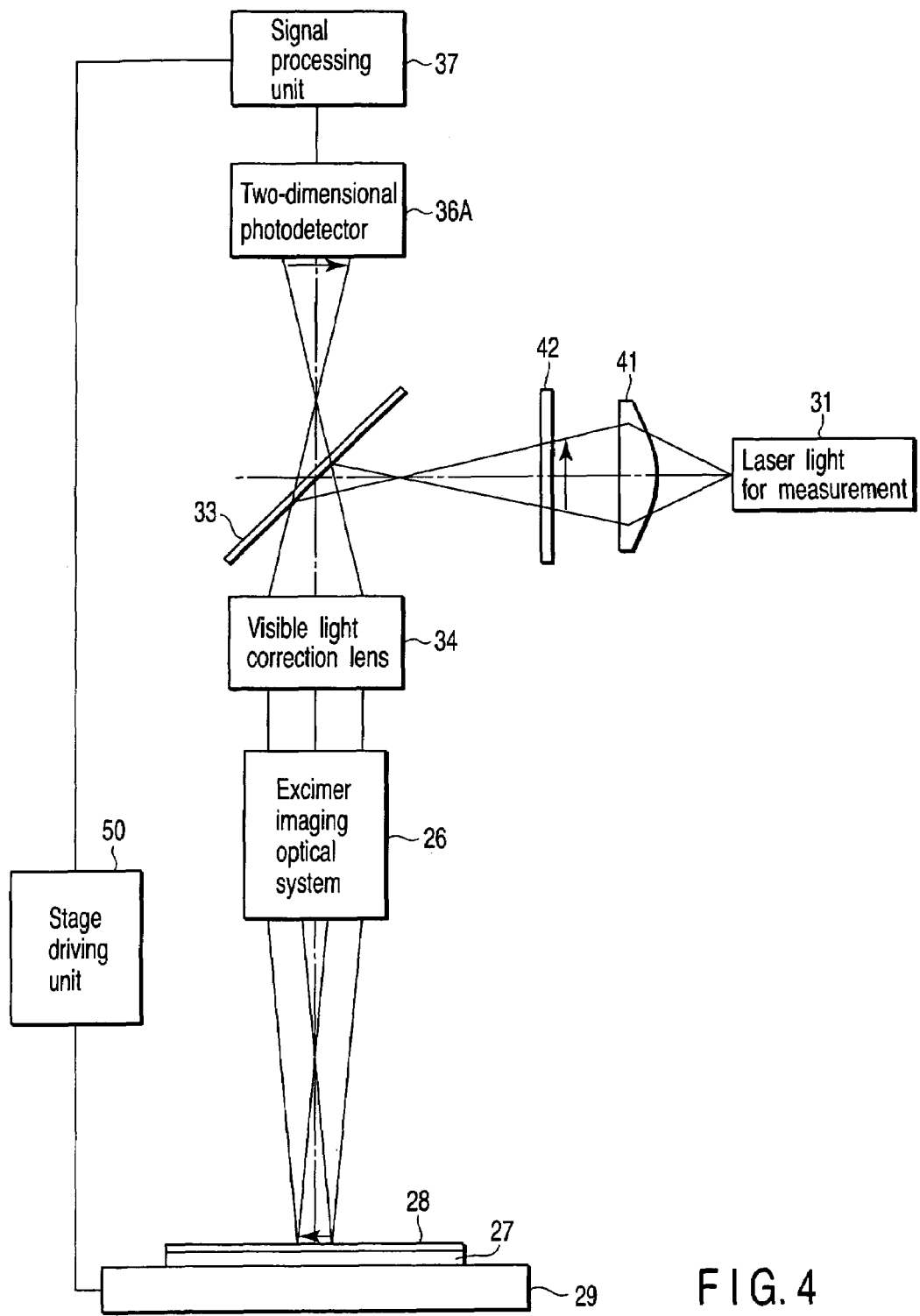
FIG. 4 is a diagram showing one example of a substrate height correction system using a two-dimensional image according to a second embodiment of the present invention.

One example of the present embodiment is shown in FIG. 4. In FIG. 4, an optical system 2 for crystallization is the same as that in FIG. 1, and therefore a crystallization optical system 2 other than an excimer imaging optical system 26 is omitted. In the present embodiment, visible laser light from a light source 31 for measurement illuminates an image mask 42 having a predetermined pattern for measurement through an illuminating lens 41. The image of the mask pattern for the measurement is reflected on a half mirror 33, directed toward the substrate 27 to be crystallized, and imaged on the non-single crystal semiconductor film 28 on the substrate 27 through a visible light correction lens 34, and the excimer imaging optical system 26. An visible light optical system is designed in such a manner that the imaging position of the visible laser light coincides with that of the excimer laser light for crystallization.

The mask pattern reflected from the non-single crystal semiconductor film 28 returns along a reverse path including the excimer imaging optical system 26 and visible light correction lens 34, and passes through the half mirror 33 to reach a light receiving face of the two-dimensional photodetector 36A. In the present embodiment, a pinhole 35 used in the first embodiment is removed from the light path, and the two-dimensional photodetector 36A is disposed in a position where the pinhole 35 has been disposed. That is, a photo-detecting surface of the two-dimensional photodetector 36A is disposed in a position conjugated with the imaging position of the measurement laser light on the non-single crystal semiconductor film 28 side. By this arrangement, if the non-single crystal semiconductor film 28 shifts from the imaging position of the laser light for the crystallization, that is, the imaging position of the visible laser light for the measurement, then the reflected image detected by the two-dimensional photodetector 36A blurs. As the two-dimensional photodetector 36A, for example, a two-dimensional CCD imaging device can be used. The image obtained by the two-dimensional CCD imaging device 36A is processed by a signal processing unit 37. The imaging position shift of the non-single crystal semiconductor film 28 is corrected by adjusting a position of a substrate holding stage 29 via a stage driving unit 50.

Figure 5:
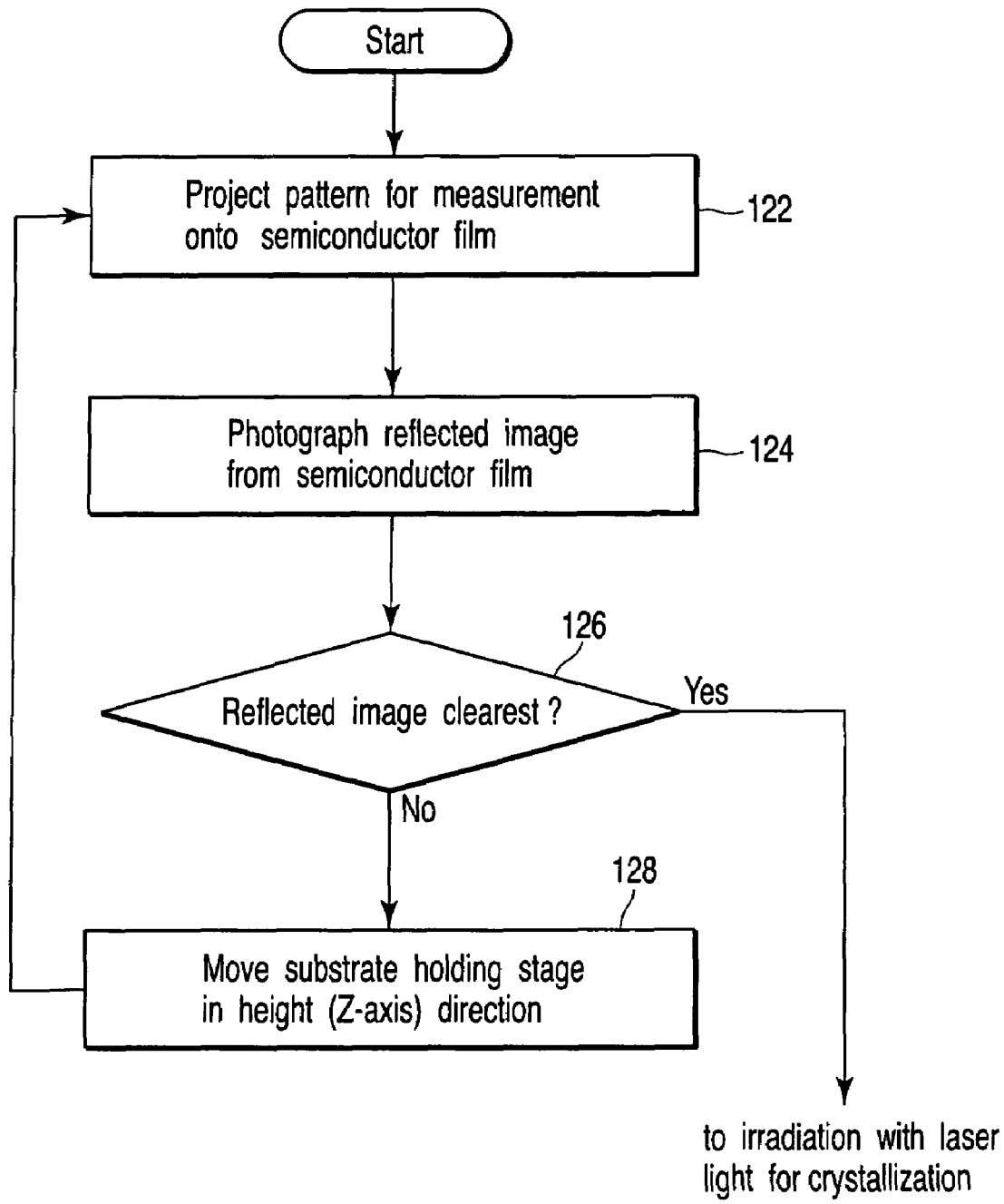
FIG. 5 is a flowchart showing one example of substrate height correction process according to the second embodiment.

A flowchart of a method for correcting a shift of the non-single crystal semiconductor film 28 on the substrate 27 with respect to the imaging position using the two-dimensional image is shown in FIG. 5. For example, a line and space pattern disposed at a predetermined interval can be used as the mask pattern for the measurement.

In step 122, the mask pattern for the measurement is projected on the non-single crystal semiconductor film 28 through the visible light correction lens 34 and the excimer imaging optical system 26. The mask pattern reflected on the non-single crystal semiconductor film 28 returns along a reverse path, and passes through the converging lens 32, and then an image of the mask pattern is photographed by the two-dimensional photodetector 36A in step 124.

In step 126, a reflected image of the mask pattern for the measurement photographed by the two-dimensional photodetector 36A is processed by the signal processing unit 37, and clearness of the image is evaluated. Specifically, while the height of the substrate 27 to be crystallized is changed little by little, the clearness of the image of the mask pattern is evaluated, and then a position where the image becomes clearest is decided. At this position, the imaging position of the excimer imaging optical system 26 coincides with the non-single crystal semiconductor film 28. To evaluate the clearness of the image, for example, clearness of an outer shape of the mask pattern, and/or contrast between line and space portions can be used.

If it is decided that the image of the mask pattern for the measurement is not clearest, at step 128, then the substrate holding stage 29 is moved in a height (Z-axis) direction via the stage driving unit 50 to change the height of the non-single crystal semiconductor film 28. Then the process returns to step 122, and the measurement is repeated. If it is decided that the image of the mask pattern is clearest, then the non-single crystal semiconductor film 28 is coincide with the imaging position of the laser light for the crystallization. Then the process proceeds to the irradiation with the laser light for the crystallization.

In the present embodiment, since the excimer imaging optical system 26 is incorporated in the light path of the laser light for the measurement, the imaging position shift generated by the thermal lens effect of the excimer imaging optical system 26 is also corrected as the shift of the imaging position of the laser light for the measurement. Therefore, according to the present embodiment, it can be corrected both the imaging position shift of the excimer imaging optical system 26 caused by the thermal lens effect and the imaging position shift attributed to the flatness of the substrate 27 to be crystallized simultaneously.

THIRD EMBODIMENT

A third embodiment relates to one example of a correction system capable of more precisely correcting a substrate position even if a change of lens temperature of an excimer imaging optical system 26 is large. Exactly speaking, a temperature coefficient of refractive index of a lens differs by wavelength of lights, i.e., temperature change in the refractive index of the lens differs for excimer laser light and visible laser light. In the present embodiment, the difference of the temperature change in refractive index of the lens caused by difference of wavelength of the light is further corrected.

The refractive index of the lens varies with the wavelength of light passed. For example, in calcium fluoride ($CaF_2$), the refractive index for ultraviolet light having a wavelength of 0.2 µm is 1.4951, whereas the refractive index for visible light having a wavelength of 0.5 µm is 1.4365. The difference is about 4%. In fused silica for ultraviolet rays (UV-$SiO_2$), the refractive index for ultraviolet light having a wavelength of 0.2144 µm is 1.5337, whereas the refractive index for visible light having a wavelength of 0.6438 µm is 1.4567. The difference is more than 5%. Temperature coefficient of the refractive index and a thermal expansion coefficient are $-0.95$ to $-1.17 \times 10^{-5}/°$ C. and 1.65 to $1.94 \times 10^{-5}/°$ C. in $CaF_2$, respectively, and $1.00 \times 10^{-5}/°$ C. and $4.0 \times 10^{-6}/°$ C. in fused silica, respectively. Though influences to these values by temperature changes are not large in each lens, if the temperature change becomes large in the excimer imaging optical system 26 using a plurality of lenses, then resulting difference in imaging position shifts due to lights having different wavelengths caused by the effect cannot be negligibly small.

Therefore, to precisely correct the substrate position, the difference between imaging position shifts due to different wavelengths has to be corrected considering wavelength dependence of the refractive indexes, temperature coefficients of the refractive index, and thermal expansion coefficient of the lens as described above. However, since the lens constitution of the excimer imaging optical system 26 differs with the apparatus, it is not easy to universally correct the difference in the imaging positions due to the different light wavelengths caused by the temperature change of the optical system.

Figure 6:
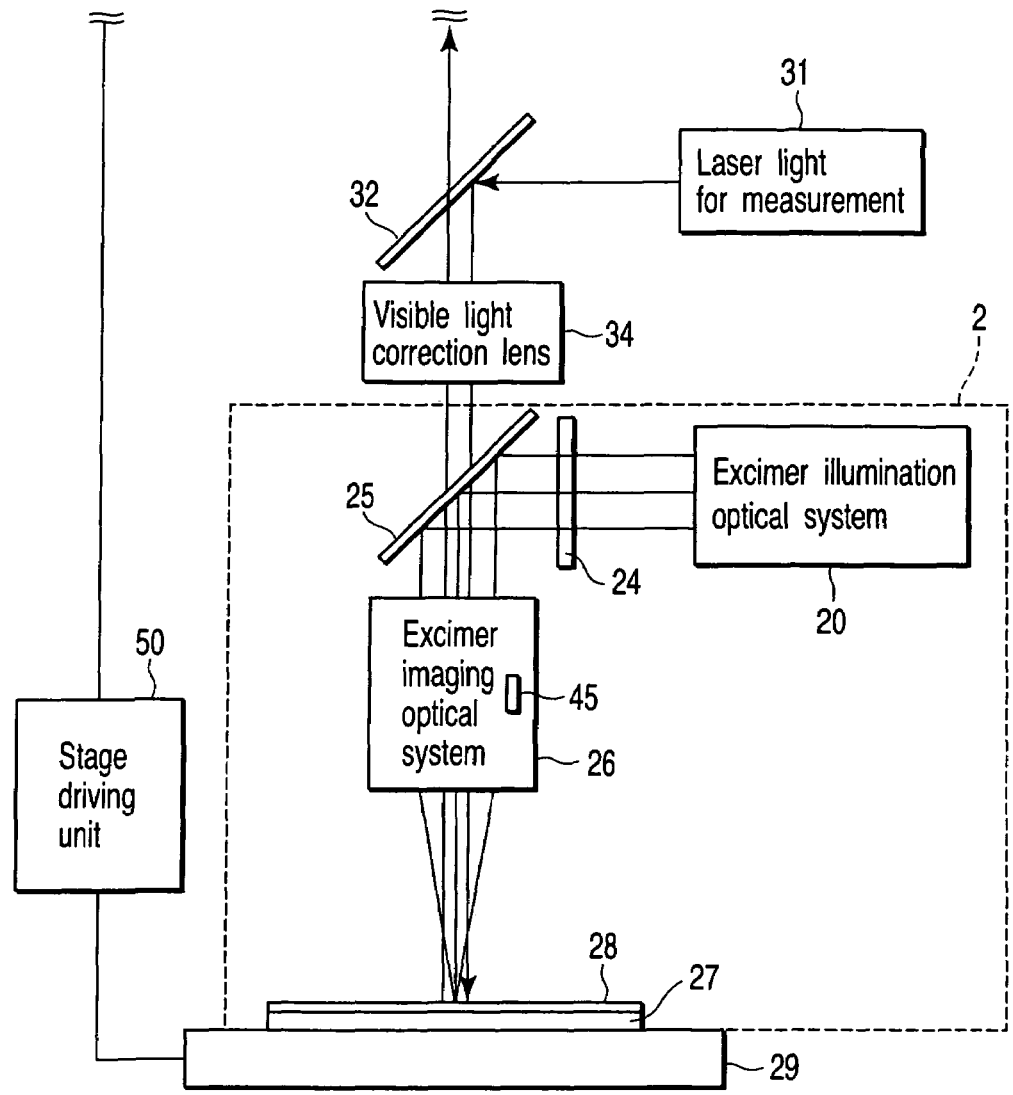
FIG. 6 shows one example of a main part of a laser crystallization apparatus according to a third embodiment.

To execute it practically, for the excimer imaging optical system 26 to be used, the temperature of the excimer imaging optical system 26 is changed by predetermined amounts in advance, then the shift in the imaging position at each temperature is measured both for the excimer laser light and the visible laser light. These measurement results are stored in the signal processing unit 37 as, for example, a correlation table for the optical system temperature-imaging position shift for that excimer imaging optical system. In addition, as shown in FIG. 6, a temperature sensor 45 is attached to the excimer imaging optical system 26 to monitor the temperature of the excimer imaging optical system 26. As the temperature sensor 45, for example, a semiconductor temperature detection element, such as a thermistor, or a thermocouple, such as a copper-constantan, can be used.

Figure 7:
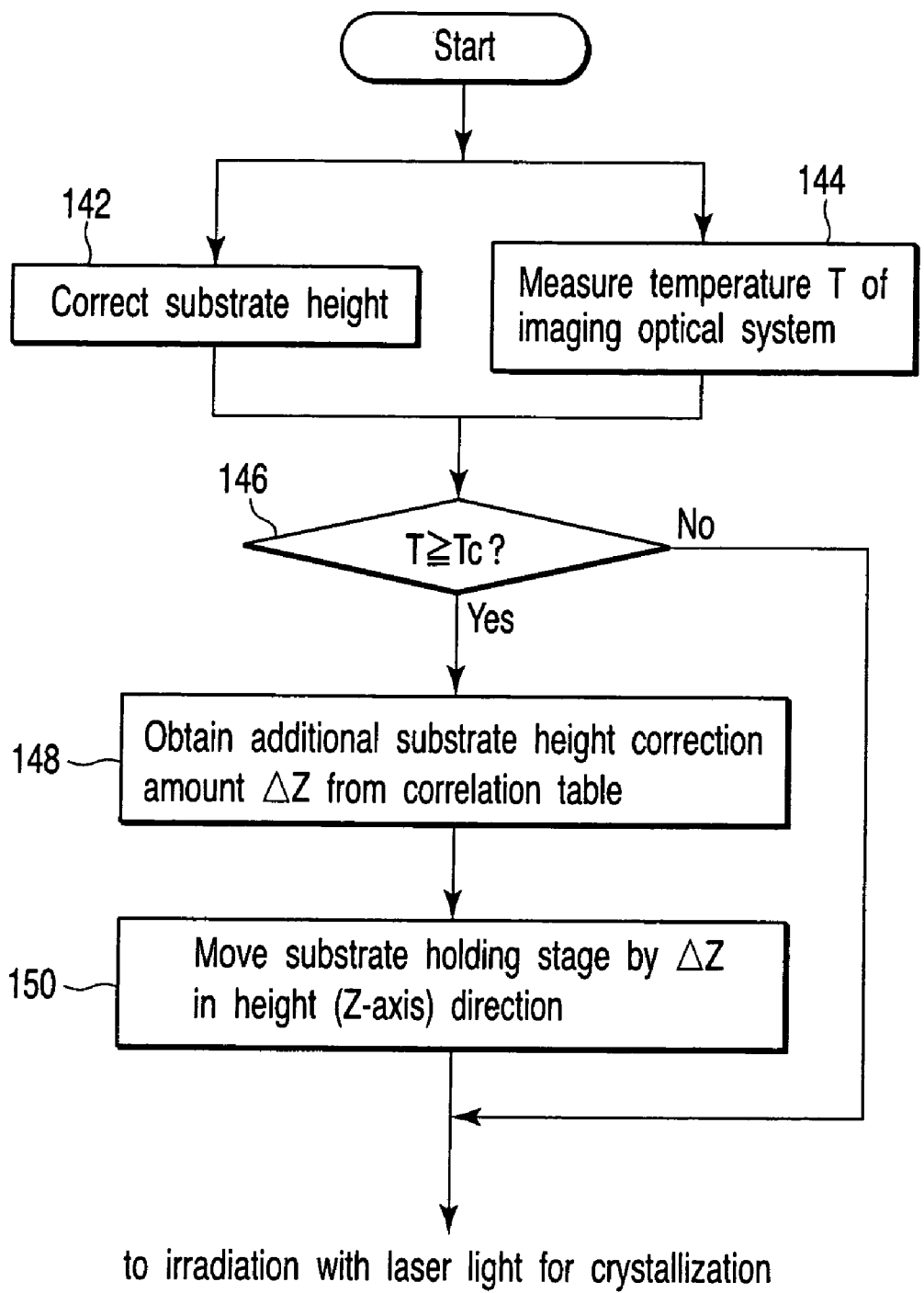
FIG. 7 is a flowchart showing one example of substrate height correction process including correction related to a temperature of an imaging optical system according to the third embodiment.

The difference of the imaging position shift between the excimer laser light and the visible laser light caused by the different temperature coefficients of the refractive index of the excimer imaging optical system 26 can further be corrected based on the monitored lens temperature of the excimer imaging optical system 26, and correlation table for the optical system temperature-imaging position shift stored beforehand in addition to the correction of the imaging position provided in the first or second embodiment FIG. 7 is a flowchart showing correction of a substrate position by the present embodiment considering the difference of the shift in the imaging position between the excimer laser light and the visible laser light caused by the difference of temperature coefficient of the refractive index of the excimer imaging optical system 26.

The correlation table for the optical system temperature-imaging position shift amount is prepared and stored in the signal processing unit 37 in advance. Furthermore, a critical temperature Tc of the excimer imaging optical system 26 requiring additional substrate position correction is set. That is, the temperature of the excimer imaging optical system 26, at which the difference of above-described shift in the imaging positions reaches to an allowable predetermined value, is set as the critical temperature Tc consulting the correlation table. The allowable shift in the imaging positions can be set, for example, to a position where a focal distance of the excimer imaging optical system 26 is shifted by $7\lambda/100$ in wave aberration.

On one hand, the shift of the position of the substrate 27 due to the thermal lens effect by the temperature change of the excimer imaging optical system 26 is corrected using, for example, the method according to the first or second embodiment, in step 142. Accordingly, the non-single crystal semiconductor film 28 on the substrate 27 is coincided with the imaging position of the excimer laser light for the crystallization without considering the difference in imaging positions due to the difference of the temperature coefficient of the refractive index of the lens between the excimer laser light and the visible laser light.

On the other hand, in step 144, a temperature T of the excimer imaging optical system 26 is measured by the temperature sensor 45 in parallel with step 142. It is decided in step 146 whether the measured temperature T is higher than the critical temperature Tc. If the temperature T is higher than the critical temperature Tc, then it is decided that an additional substrate position correction is required, and then the process proceeds to step 148. If the temperature T is lower than the critical temperature Tc, then an additional substrate position correction is not required, and the process proceeds to the irradiation of the laser light for the crystallization.

In step 148, an additional position correction amount $\Delta z$ of the substrate 27 corresponding to the measured temperature T is obtained from the correlation table for the optical system temperature-imaging position shift stored in the signal processing unit 37. Then, in step 150, the substrate holding stage 29 is additionally corrected by the position correction amount $\Delta z$ via the stage driving unit 50, and the process proceeds to the irradiation of the laser light for crystallization.

Thus, it can be more precisely corrected not only the imaging position shift caused by the flatness of the substrate 27 and the imaging position shift due to the thermal lens effect of the excimer imaging optical system 26, but also the shift in the imaging positions caused by the difference in the temperature coefficient of the refractive index of the imaging optical system 26 by the wavelength between laser light for crystallization and that for measurement.

As described above, according to the present invention, it can be simultaneously corrected both the shift of the imaging position by the thermal effects of the optical system for the crystallization and the shift of the imaging position due to the flatness of the substrate to be crystallized. As a result, there can be provided the laser crystallization apparatus and crystallization method, capable of stabilizing the crystallization process, and efficiently crystallizing the high-quality semiconductor thin film.

The present invention is not limited to the above-described embodiments, and various modifications and implementations can be executed without departing from the scope in its implementation stage. Furthermore, the above-described embodiments include various stages, and various inventions can be extracted by an appropriate combination of a plurality of described constituting elements. For example, several constituting elements can be deleted from all constituting elements described in the embodiment.

The above description of the embodiments has been given in such a manner that any person skilled in the art can prepare or make use the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser crystallization apparatus comprising an crystallization optical system which irradiates laser light to a thin film disposed on a substrate to form an image of the laser light thereon through an imaging optical system to melt and crystallize an irradiated region of the thin film, the apparatus comprising:

a measurement light source which is disposed outside a light path of the laser light, and which emits imaging position measurement light to illuminate the irradiated region of the thin film;

an imaging position measurement light illumination optical system which illuminates the imaging position measurement light on the irradiated region of the thin film through the imaging optical system to form an image of the imaging position measurement light on the thin film to detect a surface level thereof;

a detecting unit which determines an imaging position shift between the surface level of the irradiated region of the thin film and an imaging plane of the imaging optical system based on the formed image of the imaging position measurement light on the irradiated region of the thin film;

an imaging position correcting unit which corrects the surface level of the irradiated position of the thin film to a level with the imaging position shift being within a desired range, if the imaging position shift is out of predetermined range; and a control unit which controls an emission of the laser light from a laser light source, if the imaging position shift is within the predetermined range.

2. A laser crystallization apparatus comprising a crystallization optical system which comprises a laser light source which emits laser light; a phase modulating element which is disposed on a light path of the laser light and modulates the laser light to have a light intensity distribution of an inverse peak pattern to form crystallization laser light; and an imaging optical system which irradiates the crystallization laser light to a thin film disposed on a substrate to be crystallized to melt and crystallize an irradiated region of the thin film, the apparatus comprising:

a measurement light source which is disposed outside a light path of the crystallization laser light, and which emits imaging position measurement light to illuminate the irradiated region of the thin film to form an image of the imaging position measurement light thereon;

an imaging position measurement light illumination optical system which illuminates the imaging position measurement light on the irradiated region of the thin film through the imaging optical system to form an image of the imaging position measurement light on the thin film to detect a surface level thereof;

a detecting unit which determines an imaging position shift between the surface level of the irradiated region of the thin film and an imaging plane of the imaging optical system based on the formed image of the imaging position measurement light on the irradiated region of the thin film;

an imaging position correcting unit which corrects the surface level of the irradiated position of the thin film to a level with the imaging position shift being within a desired range, if the imaging position shift is out of predetermined range; and a control unit which controls an emission of the laser light from a laser light source, if the imaging position shift is within the predetermined range.

3. The laser crystallization apparatus according to claim 2, wherein the imaging position shift is detected based on light intensity of reflected imaging position measurement light, or distortion, defocusing, or enlargement of the image of the imaging position measurement light.

4. The laser crystallization apparatus according to claim 2, wherein the imaging position shift is determined by detecting a reflected image of the imaging position measurement light through a pinhole, the reflected image being from the image formed on the irradiated region of the thin film.

5. The laser crystallization apparatus according to claim 2, wherein the crystallization laser light is ultraviolet excimer laser light, wherein the imaging optical system is an optical system designed for the excimer laser light, and wherein the imaging position measurement light is visible laser light and enters to the imaging optical system through a visible light correction optical system to correct aberration of the visible light by the imaging optical system.

6. The laser crystallization apparatus according to claim 2, wherein an imaging position correcting unit corrects a surface level of the irradiated region of the thin film by moving a substrate holding stage mounting the substrate in a height direction.

* * * * *

UNITED STATES PATENT AND TRADEMARK OFFICE
CERTIFICATE OF CORRECTION

PATENT NO.       : 7,427,764 B2
APPLICATION NO.  : 11/104629
DATED            : September 23, 2008
INVENTOR(S)      : Takami It is certified that error appears in the above-identified patent and that said Letters Patent is hereby corrected as shown below:

On the title page, Item (73), the Assignee information is incorrect. Item (73) should read:

-- (73) Assignee: Advanced LCD Technologies Development Center Co., Ltd., Yokohama (JP) --

Signed and Sealed this

Second Day of December, 2008

JON W. DUDAS
*Director of the United States Patent and Trademark Office*